(12) United States Patent
Noguchi et al.

(10) Patent No.: US 11,769,838 B2
(45) Date of Patent: *Sep. 26, 2023

(54) SEMICONDUCTOR DEVICE WITH CHANGE STORAGE LAYER

(71) Applicant: Kioxia Corporation, Tokyo (JP)

(72) Inventors: Masaki Noguchi, Mie (JP); Akira Takashima, Tokyo (JP); Tatsunori Isogai, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/731,721

(22) Filed: Apr. 28, 2022

(65) Prior Publication Data
US 2022/0254935 A1 Aug. 11, 2022

Related U.S. Application Data

(63) Continuation of application No. 16/551,270, filed on Aug. 26, 2019, now Pat. No. 11,342,468.

(30) Foreign Application Priority Data

Mar. 1, 2019 (JP) ................................ 2019-037406

(51) Int. Cl.
*H01L 29/792* (2006.01)
*H01L 29/51* (2006.01)
(Continued)

(52) U.S. Cl.
CPC ........ *H01L 29/7926* (2013.01); *H01L 29/513* (2013.01); *H10B 43/27* (2023.02); *H10B 43/35* (2023.02); *H01L 23/528* (2013.01); *H01L 28/60* (2013.01); *H01L 29/40117* (2019.08); *H01L 29/518* (2013.01)

(58) Field of Classification Search
CPC ............ H01L 29/7926; H01L 27/1157; H01L 27/11582; H01L 29/513; H01L 23/528; H01L 28/60; H01L 29/40117; H01L 29/408; H01L 29/518
See application file for complete search history.

(56) References Cited

U.S. PATENT DOCUMENTS 7,858,464 B2   12/2010   Chae
9,991,277 B1   6/2018    Tsutsumi
(Continued)

OTHER PUBLICATIONS

Wu et al., "Comprehensive Investigations on Charge Diffusion Physics in SiN-based 3D NAND Flash Memory through Systematical Ab initio Calculations", 2017 IEDM, 95, 0405.
(Continued)

*Primary Examiner* — Patricia D Valenzuela
(74) *Attorney, Agent, or Firm* — Foley & Lardner LLP (57) ABSTRACT

A semiconductor device includes a semiconductor layer, a charge storage layer disposed on the surface of the semiconductor layer via a first insulating film, and an electrode layer disposed on the surface of the charge storage layer via a second insulating film. The charge storage layer includes a first layer containing elemental aluminum and elemental nitrogen, a second layer containing elemental silicon and elemental nitrogen, and a third layer containing elemental oxygen.

15 Claims, 8 Drawing Sheets

(51) Int. Cl.
  *H10B 43/27* (2023.01)
  *H10B 43/35* (2023.01)
  *H01L 49/02* (2006.01)
  *H01L 23/528* (2006.01)
  *H01L 21/28* (2006.01)

(56) References Cited

U.S. PATENT DOCUMENTS

| | | | |
|---|---|---|---|
| 11,342,468 B2 * | 5/2022 | Noguchi | ............... H01L 29/408 |
| 2009/0134450 A1 | 5/2009 | Kim | |
| 2010/0006923 A1 | 1/2010 | Fujitsuka | |
| 2010/0072539 A1 | 3/2010 | Yasuda | |
| 2017/0263640 A1 | 9/2017 | Takashima | |
| 2019/0319043 A1 * | 10/2019 | Takashima | .......... H01L 29/4234 |

OTHER PUBLICATIONS

Yan et al., "Origins of optical absorption and emission lines in AlN "AIP Applied Physics Letters 105, 111104 (2014).
Robertson, "High dielectric constant gate oxides for metal oxide Si transistors" Rep. Prog. Phys. 69 (2006) 327-396.
Badylevich et al., "Electronic structure of the interface of aluminum nitride with Si(100)" Journal of Applied Physics 104, 093713 (2008).

\* cited by examiner

SEMICONDUCTOR DEVICE WITH CHANGE STORAGE LAYER

CROSS-REFERENCE TO RELATED APPLICATION(S)

This application is a continuation of U.S. patent application Ser. No. 16/551,270, filed Aug. 26, 2019, which is based upon and claims the benefit of priority from Japanese Patent Application No. 2019-037406, filed Mar. 1, 2019, the entire contents of which are incorporated herein by reference.

FIELD

Embodiments described herein relate generally to a semiconductor device.

BACKGROUND

A charge storage layer of a semiconductor memory generally has a silicon nitride film or a polysilicon layer. However, it is desirable if a charge storage layer having a different structure can have an enhanced performance.

Examples of related art include: U.S. Patent Application Publication No. 2009/0134450; Chen et al., 2017 IEDM, 95, 0405; Qimin Tan et al., APL 105, 111104 (2014); J. Robertson, Rep. Prog. Phys. 69 (2006) 327; and M. Badylevich, J. Appl. Phys. 104, 093713.

DETAILED DESCRIPTION

At least one embodiments provides a semiconductor device which can enhance the performance of a charge storage layer.

In general, according to at least one embodiment, a semiconductor device includes a semiconductor layer, a charge storage layer provided on the surface of the semiconductor layer via a first insulating film, and an electrode layer provided on the surface of the charge storage layer via a second insulating film. The charge storage layer includes a first layer containing elemental aluminum and elemental nitrogen, a second layer containing elemental silicon and elemental nitrogen, and a third layer containing elemental oxygen.

Embodiments of the present disclosure will now be described with reference to the drawings. In FIGS. 1 through 11, the same symbols are used for the same or similar components or elements, and a duplicate description thereof is omitted.

First Embodiment

Figure 1:
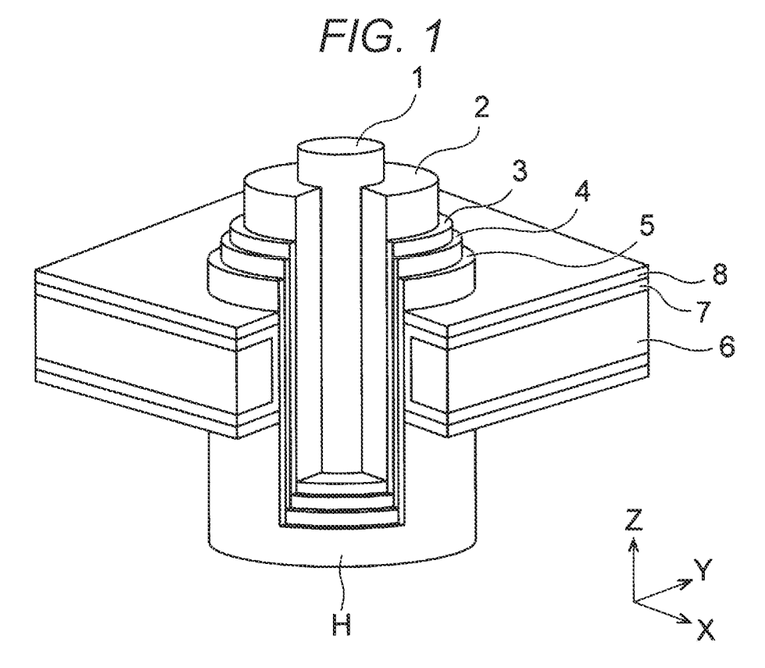
FIG. 1 is a perspective view showing the structure of a semiconductor device according to a first embodiment.

FIG. 1 is a perspective view showing the structure of a semiconductor device according to a first embodiment. The semiconductor device of FIG. 1 is, for example, a three-dimensional NAND memory.

The semiconductor device of FIG. 1 includes a core insulating film 1, a channel semiconductor layer 2, a tunnel insulating film 3, a charge storage layer 4, a block insulating film 5, an electrode material layer 6, a first metal layer 7, and a second metal layer 8. The tunnel insulating film 3 is an example of a first insulating film, and the block insulating film 5 is an example of a second insulating film.

Referring to FIG. 1, a plurality of electrode layers and a plurality of insulating layers are stacked alternately on a substrate, and a memory hole H is provided such that it penetrates the electrode layers and the insulating layers. Each electrode layer is composed of the electrode material layer 6, etc. and functions as a gate electrode (word line). FIG. 1 shows an X direction and a Y direction which are parallel to the surface of the substrate and perpendicular to each other, and a Z direction perpendicular to the surface of the substrate. A +Z direction is herein treated as an upward direction, and a −Z direction as a downward direction. The −Z direction may or may not coincide with the direction of gravitational force.

The core insulating film 1, the channel semiconductor layer 2, the tunnel insulating film 3, the charge storage layer 4 and the block insulating film 5 are formed in the memory hole H and constitute a memory cell. In particular, the block insulating film 5 is formed on the surfaces of the electrode layers and the insulating layers, exposed in the memory hole H, and the charge storage layer 4 is formed on the surface of the block insulating film 5. The charge storage layer 4 stores electric charge between one side surface (outer peripheral surface) and the other side surface (inner peripheral surface). The tunnel insulating film 3 is formed on the surface of the charge storage layer 4, and the channel semiconductor layer 2 is formed on the surface of the tunnel insulating film 3. The channel semiconductor layer 2 functions as a channel of the memory cell. The core insulating film 1 is formed in the channel semiconductor layer 2.

The block insulating film 5 is, for example, a stacked film including an $Al_2O_3$ film (aluminum oxide film) and an $SiO_2$ film (silicon oxide film). The charge storage layer 4 is, for example, a stacked film including an AlN film (aluminum nitride film), an SiN film (silicon nitride film) and an $SiO_2$ film. The charge storage layer 4 may include an SiON film (silicon oxynitride film) instead of an $SiO_2$ film. The details of the charge storage layer 4 will be described later. The tunnel insulating film 3 is, for example, an $SiO_2$ film. The channel semiconductor layer 2 is, for example, a polysilicon layer. The core insulating film 1 is, for example, an $SiO_2$ film.

The electrode material layer 6, the first metal layer 7 and the second metal layer 8 are, for example, a W layer (tungsten layer), a TiN film (titanium nitride film) and an Al$_2$O$_3$ film, respectively. In this case, the first metal layer 7 functions as a barrier metal layer in the electrode layer, and the second metal layer 8 functions as a block insulating film together with the block insulating film 5.

Figure 2A:
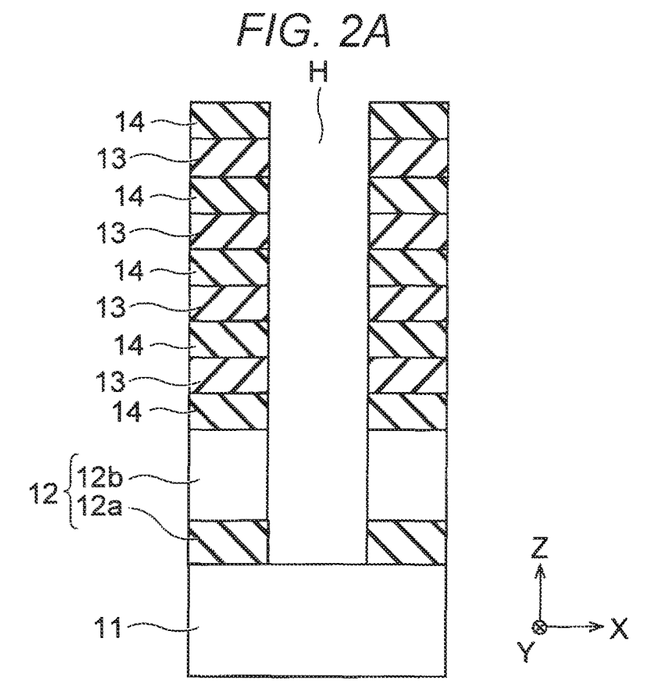
FIGS. 2A and 2B are cross-sectional views illustrating a method for manufacturing the semiconductor device according to the first embodiment.
Figure 2B:
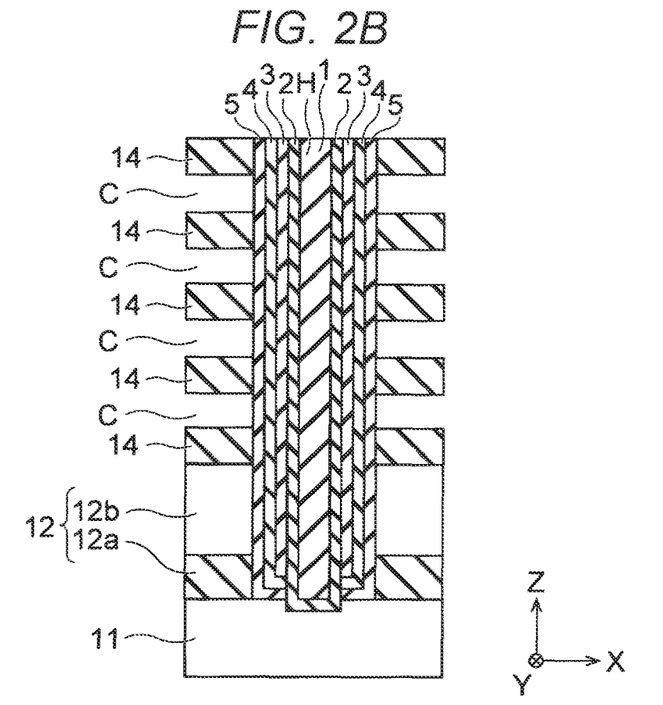

FIGS. 2A and 2B are cross-sectional views illustrating a method for manufacturing the semiconductor device according to the first embodiment.

First, an underlayer 12 is formed on a substrate 11, and a plurality of sacrificial layers 13 and a plurality of insulating layers 14 are formed alternately on the underlayer 12 (FIG. 2A). Next, a memory hole H, penetrating the underlayer 12, the sacrificial layers 13 and the insulating layers 14, is formed (FIG. 2A).

The substrate 11 is, for example, a semiconductor substrate such as a silicon substrate. The underlayer 12 is, for example, a stacked film including an interlayer insulating film 12a provided on the substrate 11, and a semiconductor layer 12b provided on the interlayer insulating film 12a. An SiO$_2$ film or an SiN film is an example of the interlayer insulating film 12a. A polysilicon layer is an example of the semiconductor layer 12b. Each sacrificial layer 13 is, for example, an SiN film. Each insulating layer 14 is, for example, an SiO$_2$ film.

In this embodiment, a plurality of cavities are formed between the insulating layers 14 by removing the sacrificial layers 13, and then a second metal layer 8, a first metal layer 7 and an electrode material layer 6 are sequentially formed in each cavity, as will be described below. As a result, the above-described electrode layers are formed in the cavities. This process is termed a replacement process. In the case of not using such a replacement process, the electrode layers are formed instead of the sacrificial layers 13 in the process step of FIG. 2A.

Next, a block insulating film 5, a charge storage layer 4, a tunnel insulating film 3 and a channel semiconductor layer 2 are sequentially formed on the surfaces of the underlayer 12, the sacrificial layers 13 and the insulating layers 14, exposed in the memory hole H, and the remainder of the memory hole H is filled with a core insulating film 1 (FIG. 2B). Next, not-shown grooves are formed in the sacrificial layers 13 and the insulating layers 14 and, using the grooves, the sacrificial layers 13 are etched away with a liquid chemical such as phosphoric acid. As a result, cavities C are formed between the insulating layers 14 (FIG. 2B).

In particular, the block insulating film 5, the charge storage layer 4, the tunnel insulating film 3, the channel semiconductor layer 2 and the core insulating film 1 are formed in the following manner. First, the block insulating film 5, the charge storage layer 4 and the tunnel insulating film 3 are sequentially formed on the surfaces of the underlayer 12, the sacrificial layers 13 and the insulating layers 14, exposed in the memory hole H. Next, the block insulating film 5, the charge storage layer 4 and the tunnel insulating film 3 are etched away from the bottom of the memory hole H, whereby the substrate 11 becomes exposed in the memory hole H. Next, the channel semiconductor layer 2 and the core insulating film 1 are sequentially formed in the memory hole H.

Thereafter, the second metal layer 8, the first metal layer 7 and the electrode material layer 6 are sequentially formed in each cavity C (see FIG. 1). As a result, the above-described electrode layers are formed in the cavities C. The semiconductor device of FIG. 1 is thus manufactured. The underlayer 12b may also be formed by first forming a sacrificial layer, and removing the sacrificial layer and forming a polysilicon layer by a replacement process.

Figure 3:
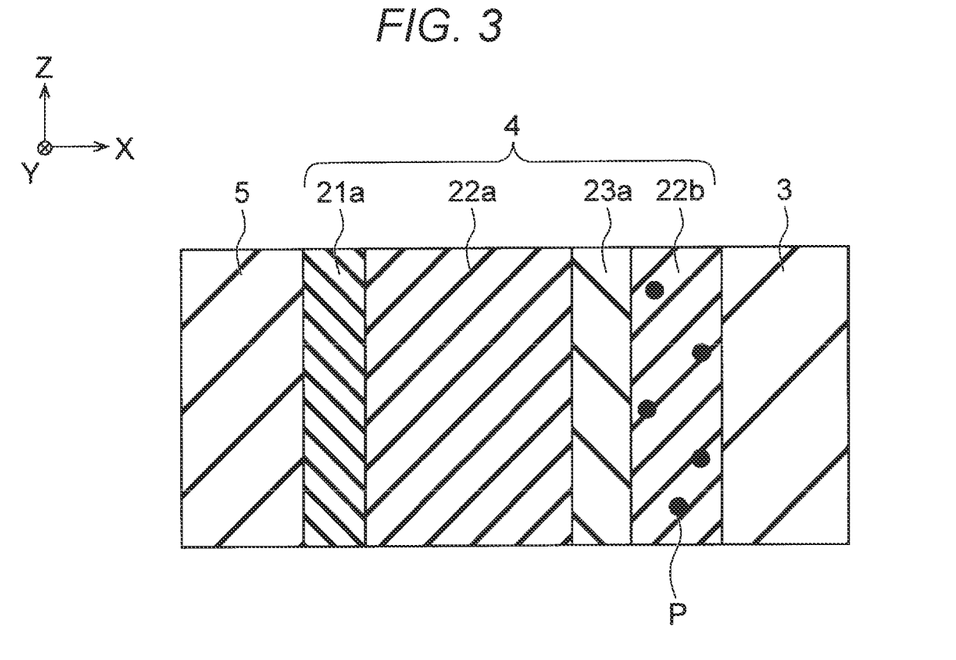
FIG. 3 is a cross-sectional view showing the structure of the semiconductor device according to the first embodiment.

FIG. 3 is a cross-sectional view showing the structure of the semiconductor device according to the first embodiment.

As shown in FIG. 3, the charge storage layer 4 of this embodiment includes an AlN film 21a, an SiN film 22a, an SiO$_2$ film 23a and an SiN film 22b, formed in this order on the surface of the block insulating film 5. The AlN film 21a is an example of a first layer, the SiN films 22a, 22b are an example of a second layer, and the SiO$_2$ film 23a is an example of a third layer. Further, the SiN film 22a is an example of a first film constituting the second layer, and the SiN film 22b is an example of a second film constituting the second layer.

The AlN film 21a is, for example, an amorphous film. AlN is known to have a band structure similar to that of SiN, have a higher dielectric constant than SiN, and have a deep electron trap level and a deep hole trap level. The AlN film 21a of this embodiment is in contact with the surface of the block insulating film 5, and has a thickness of not less than 0.1 nm and not more than 2.0 nm.

The SiO$_2$ film 23a is isolated from the AlN film 21a. The SiO$_2$ film 23a of this embodiment has a thickness of not less than 0.1 nm and not more than 3.0 nm. The SiO$_2$ film 23a may be replaced with an SiON film. Alternatively, the SiO$_2$ film 23a may be replaced with a metal oxide film such as an Al$_2$O$_3$ film.

The SiN film 22a is provided between the AlN film 21a and the SiO$_2$ film 23a. The SiN film 22a of this embodiment is in contact with the surface of the AlN film 21a and with the surface of the SiO$_2$ film 23a, and has a thickness of not less than 0.1 nm and not more than 6.0 nm. However, since the charge storage layer 4 of this embodiment has the two SiN films 22a, 22b, the thickness of the SiN film 22a is preferably not more than 3.0 nm.

The SiN film 22b is provided on the opposite side of the SiO$_2$ film 23a from the SiN film 22a. The SiN film 22b of this embodiment is in contact with the surface of the tunnel insulating film 3, and has a thickness of not less than 0.1 nm and not more than 6.0 nm. However, since the charge storage layer 4 of this embodiment has the two SiN films 22a, 22b, the thickness of the SiN film 22b is preferably not more than 3.0 nm.

The SiN film 22b further contains aluminum atoms and oxygen atoms. The black circles P of FIG. 3 schematically indicate such atoms. It has been found experimentally that the SiN film 22b containing aluminum atoms and oxygen atoms can be obtained when the SiN film 22a is formed between the AlN film 21a and the SiO$_2$ film 23a, and the SiN film 22b is formed on the opposite side of the SiO$_2$ film 23a from the SiN film 22a and the AlN film 21a. This is considered to be due to diffusion of aluminum atoms from the AlN film 21a into the SiN film 22b and diffusion of oxygen atoms from the SiO$_2$ film 23a into the SiN film 22b. The details of this phenomenon will be described later. The SiN film 22b of this embodiment thus contains aluminum atoms and oxygen atoms as impurity atoms.

The charge storage layer 4 of this embodiment may be formed, for example, in the following manner.

After the formation of the block insulating film 5, an AlN film 21a, an SiN film 22a, an SiO$_2$ film 23a and an SiN film 22b are sequentially deposited in situ by ALD (Atomic Layer Deposition) using a vertical low-pressure batch furnace.

The AlN film 21a is formed at 300 to 400° C. in the furnace using Al(CH$_3$)$_3$ (TMA: trimethylaluminum) gas as an Al material gas, and NH$_3$ (ammonia) gas as a nitriding agent. The number of ALD cycles for the AlN film 21a is adjusted so that a desired thickness of the AlN film 21a is obtained.

The SiN film 22a is formed at a raised temperature of 700° C. in the furnace using $Si_2Cl_6$ (HCD: hexachlorodisilane) gas as an Si material gas, and $NH_3$ gas as a nitriding agent. The number of ALD cycles for the SiN film 22a is adjusted so that a desired thickness of the SiN film 22a is obtained.

The $SiO_2$ film 23a is formed at a lowered temperature of 600° C. in the furnace using $Si_2Cl_6$ gas as an Si material gas, and O*, which is produced from a mixed gas of $H_2$ (hydrogen) and $O_2$ (oxygen), as an oxidizing agent. The number of ALD cycles for the $SiO_2$ film 23a is adjusted so that a desired thickness of the $SiO_2$ film 23a is obtained.

As with the SiN film 22a, the SiN film 22b is formed at a raised temperature of 700° C. in the furnace using $Si_2Cl_6$ gas as an Si material gas, and $NH_3$ gas as a nitriding agent. The number of ALD cycles for the SiN film 22b is adjusted so that a desired thickness of the SiN film 22b is obtained.

$AlCl_3$ gas may also be used as an Al material gas for the AlN film 21a. $SiH_2Cl_2$ (DCS: dichlorosilane) gas, $SiCl_4$ (TCS: tetrachlorosilane) gas or $SiHCl_3$ (TrCS: trichlorosilane) gas may also be used as an Si material gas for the SiN film 22a, the $SiO_2$ film 23a and the SiN film 22b. $ND_3$ (deuterated ammonia) gas, NO (nitric oxide) gas or $N_2O$ (dinitrogen monoxide) gas may also be used as a nitriding agent for the SiN films 22a, 22b. $O_2$ gas, $O_3$ (ozone) gas, NO gas or $N_2O$ gas may also be used as an oxidizing agent for the $SiO_2$ film 23a.

The $SiO_2$ film 23a may be formed by heat treatment under an $O_2$ atmosphere ($O_2$ annealing) instead of ALD. The $O_2$ annealing is performed, for example, at 600 to 1100° C. In the case of forming an SiON film instead of the $SiO_2$ film 23a, it is preferred to use ALD whose one cycle consists of the supply of an Si material gas, the supply of an oxidizing agent and the supply of a nitriding agent.

It is desirable that the charge storage layer 4 being manufactured be not exposed to the atmosphere during the time interval between the formation of the AlN film 21a and the subsequent formation of the SiN film 22a in contact with the AlN film 21a. This can prevent the AlN film 21a from changing to an AlON film.

FIGS. 4A, 4B and FIGS. 5A, 5B are schematic views illustrating an electron trap according to the first embodiment.

Figure 4A:
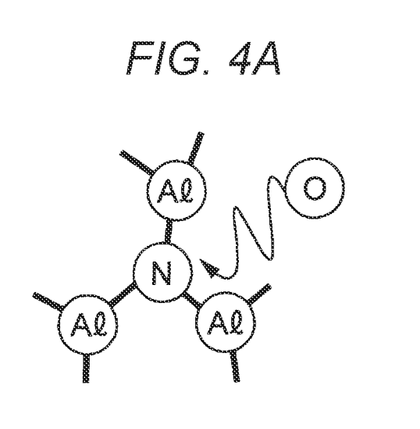
FIGS. 4A and 4B are schematic views (1/2) illustrating an electron trap according to the first embodiment.
Figure 4B:
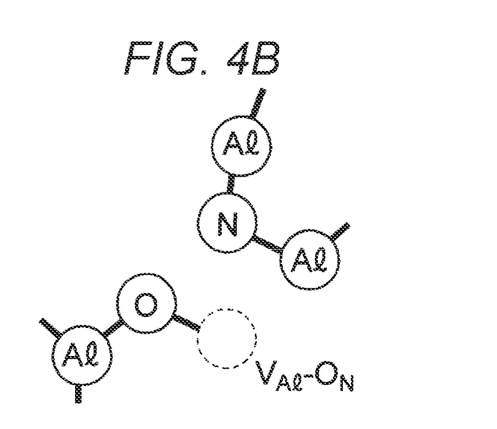

FIG. 4A illustrates how an O atom enters an AlN film. An Al atom in the AlN film binds to the O atom, and an electron trap site "$V_{Al}$—$O_N$" is formed at the front of the O atom (FIG. 4B).

Figure 5A:
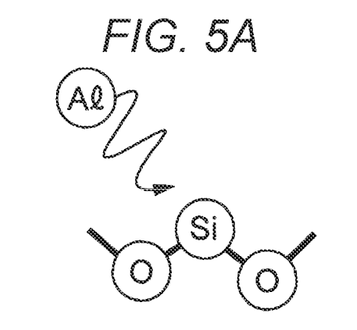
FIGS. 5A and 5B are schematic views (2/2) illustrating an electron trap according to the first embodiment.
Figure 5B:
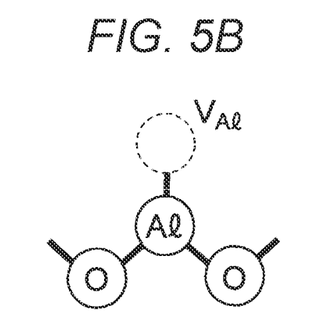

FIG. 5A illustrates how an Al atom enters an $SiO_2$ film. A Si atom in the $SiO_2$ film is replaced with the Al atom, and an electron trap site "$V_{Al}$" is formed at the front of the Al atom (FIG. 5B).

As described above, the SiN film 22b of this embodiment contains Al atoms which are considered to have diffused from the AlN film 21a, and O atoms which are considered to have diffused from the $SiO_2$ film 23a. Therefore, in the SiN film 22b, the same situation as that of FIG. 4A will be created by Al atoms that have diffused from the AlN film 21a, N atoms contained in the SiN film 22b, and O atoms that have diffused from the $SiO_2$ film 23a. Further, in the SiN film 22b, the same situation as that of FIG. 5A will be created by Al atoms that have diffused from the AlN film 21a, Si atoms contained in the SiN film 22b, and O atoms that have diffused from the $SiO_2$ film 23a. Accordingly, electron trap sites "$V_{Al}$—$O_N$" and electron trap sites "$V_{Al}$" will be formed in the SiN film 22b.

Figure 6A:
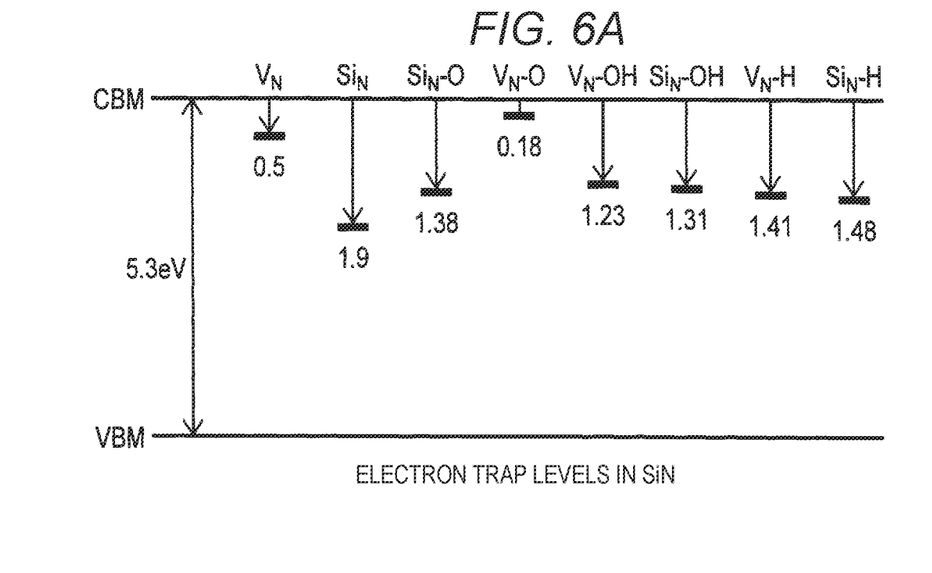
FIGS. 6A and 6B are graphs illustrating electron trap levels according to the first embodiment.
Figure 6B:
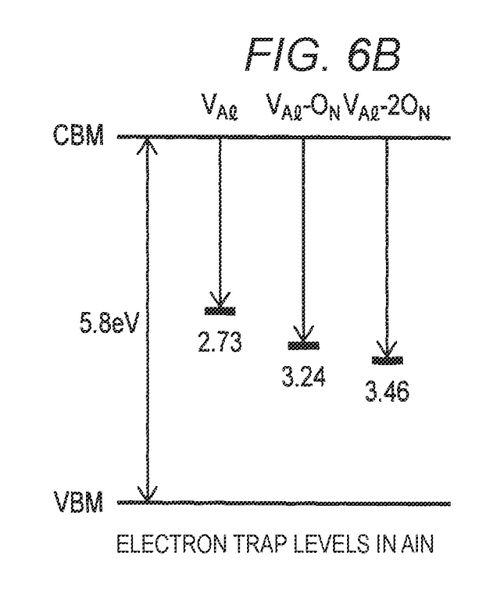

FIGS. 6A and 6B are graphs illustrating electron trap levels according to the first embodiment.

FIG. 6A shows electron trap levels at various electron trap sites in SiN. $V_N$ denotes a site formed by a defect (hole) of an N atom. $Si_N$ denotes a site formed by an interstitial strain. $Si_N$—O denotes a site formed by an interstitial strain attributable to an O atom. $V_N$—O denotes a site formed by a defect of an N atom attributable to an O atom. $V_N$—OH denotes a site formed by a defect of an N atom attributable to an OH group. $Si_N$—OH denotes a site formed by an interstitial strain attributable to an OH group. $V_N$—H denotes a site formed by a defect of an N atom attributable to an H atom. $Si_N$—H denotes a site formed by an interstitial strain attributable to an H atom.

FIG. 6B shows electron trap levels at various electron trap sites in AlN. $V_{Al}$ denotes a site formed by a defect (hole) of an Al atom. $V_{Al}$-$nO_N$ (n represents 1 or 2) denotes a site formed by a complex defect of an Al atom and an O atom.

FIGS. 6A and 6B show the various electron trap levels expressed in eV. In the Figures, CBM means "Conduction Band Minimum", and VBM means "Valence Band Maximum". In the case of SiN, the difference between CBM and VBM is about 5.3 eV. In the case of AlN, the difference between CBM and VBM is about 5.8 eV. The differences indicate band gaps.

Figure 7A:
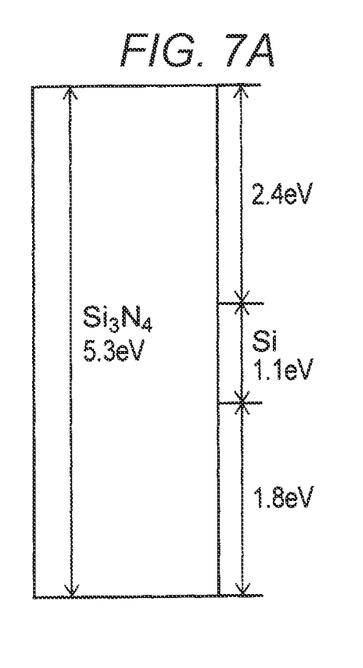
FIGS. 7A and 7B are graphs illustrating CBM and VBM according to the first embodiment.
Figure 7B:
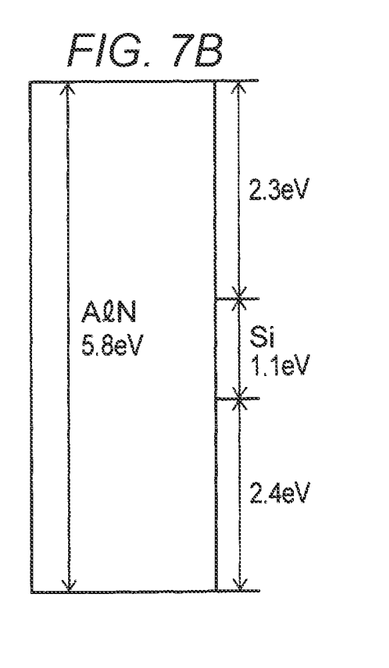

The details of the differences are illustrated in FIGS. 7A and 7B. FIGS. 7A and 7B are graphs illustrating CBM and VBM according to the first embodiment. FIG. 7A illustrates a breakdown of the difference "5.3 eV" between CBM and VBM in SiN ($Si_3N_4$). FIG. 7B illustrates a breakdown of the difference "5.8 eV" between CBM and VBM in AlN. As can be seen from the graphs, AlN has a band structure similar to that of SiN. This is why the charge storage layer 4 of this embodiment uses the AlN film in addition to the SiN films. An AlN film can store electric charge like an SiN film. Compared to an SiN film, an AlN film is more writable by 0.1 eV (2.4 eV−2.3 eV) and less erasable by 0.6 eV (2.4 eV−1.8 eV).

As can be seen from the data in FIGS. 6A and 6B, the electron trap levels at the electron trap sites "$V_{Al}$—$O_N$", "$V_{Al}$-$2O_N$" and "$V_{Al}$" are higher than those at the electron trap sites formed in SiN. This indicates that the SiN film 22b of this embodiment has a deeper electron trap level compared to an SiN film having no "$V_{Al}$—$O_N$", "$V_{Al}$-$2O_N$" and "$V_{Al}$" sites.

As described above, AlN is known to have a deep electron trap level (and a deep hole trap level). Therefore, the charge storage layer 4 of this embodiment can have a deep electron trap level in the AlN film 21a. In addition, the charge storage layer 4 of this embodiment can have a deep electron trap level also in the SiN film 22b. Thus, compared to a charge storage layer 4 solely including an SiN film, the charge storage layer 4 of this embodiment can enhance the write characteristics and the charge retention characteristics of a memory cell. For example, it becomes possible to prevent escape of electric charge from the inside of the charge storage layer 4 to the outside.

Further, in the charge storage layer 4 of this embodiment, the SiN film 22a and the SiN film 22b are separated by the $SiO_2$ film 23a. This makes it possible to prevent escape of electric charge from the inside of the charge storage layer 4 to the outside, i.e. from the memory cell to another memory cell.

As described above, the charge storage layer 4 of this embodiment includes the AlN film 21a, the SiN films 22a, 22b, and the SiO$_2$ film 23a. Therefore, according to this embodiment, it becomes possible to enhance the performance, such as the charge retention characteristics, of the charge storage layer 4.

The AlN film 21a of this embodiment is, for example, an amorphous film. In this case, the thickness of the AlN film 21a is preferably set to be not more than 2 nm. This is because if the thickness of the AlN film 21a is set to be more than 2 nm, there is a possibility that the AlN film 21a will be crystallized, resulting in the formation of irregularities in the surface of the AlN film 21a.

The thickness of the SiN film 22a is also preferably set to be not more than 2 nm. This is because if the thickness of the SiN film 22a is set to be more than 2 nm, Al atoms are less likely to diffuse from the AlN film 21a into the SiN film 22b.

The AlN film 21a may be replaced with a metal nitride film containing an elemental metal other than elemental aluminum, and elemental nitrogen. It is preferred that the metal, like aluminum, diffuse into the SiN film 22b, and provide electron trap sites which, like the sites "$V_{Al}$—$O_N$", "$V_{Al}$-2$O_N$" and "$V_{Al}$", have a deep electron trap level. Examples of the elemental metal other than elemental aluminum include elemental hafnium (Hf), elemental zirconium (Zr), etc.

This embodiment is also applicable to a two-dimensional NAND memory. In that case, a memory cell is formed by sequentially forming a tunnel insulating film 3, a charge storage layer 4, a block insulating film 5, and an electrode material layer 6 on the upper surface of a substrate 11. The substrate 11 functions as a channel semiconductor layer, and the electrode material layer 6 functions as a gate electrode (word line).

Second Embodiment

Figure 8:
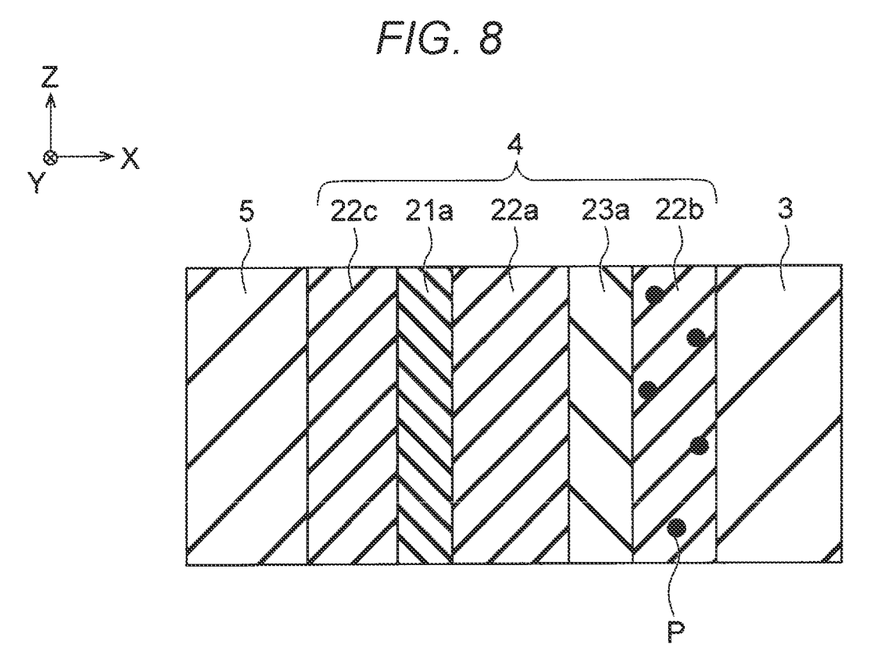
FIG. 8 is a cross-sectional view showing the structure of a semiconductor device according to a second embodiment.

FIG. 8 is a cross-sectional view showing the structure of a semiconductor device according to a second embodiment.

The charge storage layer 4 of this embodiment includes an SiN film 22c in addition to the four films of the charge storage layer 4 of the first embodiment. The SiN film 22c is an example of a third film constituting the second layer.

While the SiN film 22b is provided on the opposite side of the SiO$_2$ film 23a from the SiN film 22a, the SiN film 22c is provided on the opposite side of the AlN film 21a from the SiN film 22a. The SiN film 22c of this embodiment is in contact with the surface of the block insulating film 5 and, as with the SiN films 22a, 22b, has a thickness of not less than 0.1 nm and not more than 6.0 nm. However, since the charge storage layer 4 of this embodiment has the three SiN films 22a, 22b, 22c, the thickness of each of the SiN films 22a, 22b, 22c is preferably not more than 2.0 nm. The SiN film 22c may be formed, for example, by the same method as the SiN films 22a, 22b.

The AlN film 21a of this embodiment is not in contact with any of the SiO$_2$ film constituting the tunnel insulating film 3, the SiO$_2$ film 23a of the charge storage layer 4, and the SiO$_2$ film constituting the block insulating film 5. Therefore, if a high-temperature (e.g. not less than 700° C.) heat process is performed after the formation of the AlN film 21a, O atoms in the SiO$_2$ films can be prevented from entering the AlN film 21a. If atoms enter the AlN film 21a, charge trap sites in the AlN film 21a will decrease, resulting in deterioration of the write characteristics and the erasing characteristics of a memory cell. According to this embodiment, such deterioration can be prevented.

According to the first embodiment, on the other hand, the number of process steps for the manufacturing of the semiconductor device can be reduced by eliminating a process step for forming the SiN film 22c.

Third Embodiment

Figure 9:
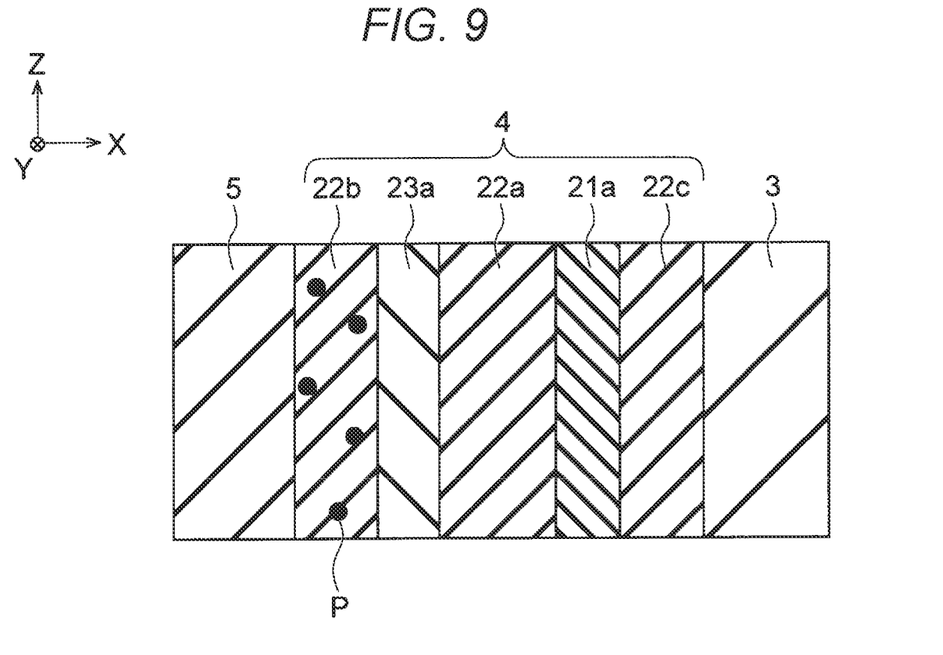
FIG. 9 is a cross-sectional view showing the structure of a semiconductor device according to a third embodiment.

FIG. 9 is a cross-sectional view showing the structure of a semiconductor device according to a third embodiment.

The charge storage layer 4 of this embodiment includes the same five films as those of the charge storage layer 4 of the second embodiment. However, in the charge storage layer 4 of this embodiment, the SiN film 22b, the SiO$_2$ film 23a, the SiN film 22a, the AlN film 21a and the SiN film 22c are arranged in this order in a direction from the block insulating film 5 toward the tunnel insulating film 3. Accordingly, the diffusing atoms (Al atoms and O atoms), indicated by the black circles P, exist in the vicinity of the block insulating film 5.

According to this embodiment, the same effects as the second embodiment can be achieved by the charge storage layer 4 which includes the five films stacked in the opposite order to that in the charge storage layer 4 of the second embodiment.

Fourth Embodiment

Figure 10:
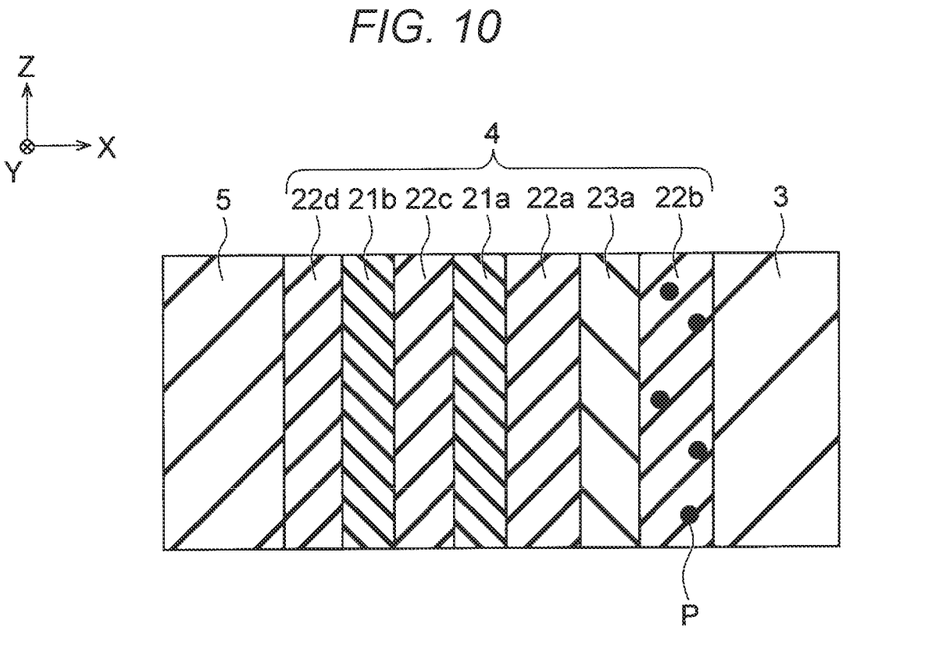
FIG. 10 is a cross-sectional view showing the structure of a semiconductor device according to a fourth embodiment.

FIG. 10 is a cross-sectional view showing the structure of a semiconductor device according to a fourth embodiment.

The charge storage layer 4 of this embodiment includes an AlN film 21b and an SiN film 22d in addition to the five films of the charge storage layer 4 of the second embodiment. As with the AlN film 21a, the AlN film 21b is an example of the first layer. As with the SiN film 22c, the SiN film 22d is an example of the third film constituting the second layer. The AlN film 21b and the SiN film 22d are provided between the SiN film 22c and the block insulating film 5, and in this order in a direction toward the block insulating film 5. The AlN film 21b may be formed, for example, by the same method as the AlN film 21a. The SiN film 22d may be formed, for example, by the same method as the SiN films 22a, 22b, 22c.

The charge storage layer 4 may thus include two or more AlN films. This can enhance the charge retention characteristics attributable to the AlN films in the charge storage layer 4. The SiN film 22b of this embodiment can be considered to contain not only Al atoms that have been diffused from the AlN film 21a, but also Al atoms that have been diffused from the AlN film 21b.

The charge storage layer 4 may include the seven films stacked in the opposite order to that in the charge storage layer 4 of the fourth embodiment.

Fifth Embodiment

Figure 11:
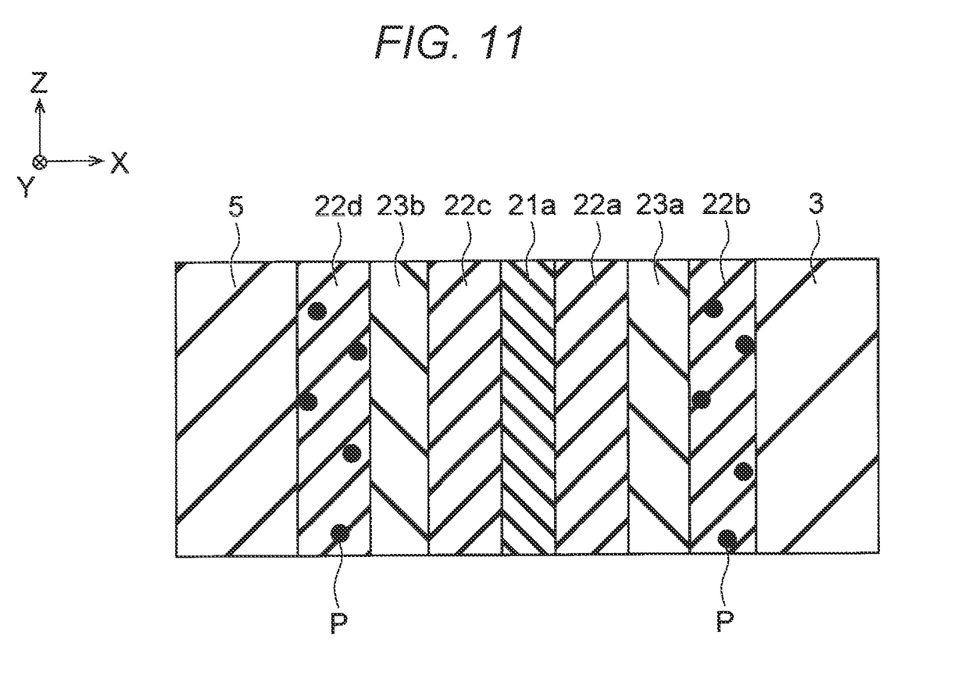
FIG. 11 is a cross-sectional view showing the structure of a semiconductor device according to a fifth embodiment.

FIG. 11 is a cross-sectional view showing the structure of a semiconductor device according to a fifth embodiment.

The charge storage layer 4 of this embodiment includes an SiO$_2$ film 23b and an SiN film 22d in addition to the five films of the charge storage layer 4 of the second embodiment. As with the SiO$_2$ film 23a, the SiO$_2$ film 23b is an example of the third layer. As with the SiN film 22b, the SiN film 22d of this embodiment is an example of the second film constituting the second layer. The SiO$_2$ film 23b and the SiN film 22d are provided between the SiN film 22c and the block insulating film 5, and in this order in a direction toward the block insulating film 5. The SiO$_2$ film 23b may be formed, for example, by the same method as the SiO$_2$ film 23a.

The charge storage layer 4 may thus include two or more SiO$_2$ films. As shown by the black circles P, the SiN film 22d, as with the SiN film 22b, contains Al atoms and O atoms. This is considered to be due to diffusion of Al atoms from the AlN film 21a into the SiN film 22d and diffusion of O atoms from the SiO$_2$ film 23b into the SiN film 22d. Thus, as with the SiN film 22b according to the first to fifth embodiments, the SiN film 22d of this embodiment contains Al atoms and O atoms as impurity atoms. According to this embodiment, the inclusion of a plurality of SiN films, each containing Al atoms and O atoms, can enhance the charge retention characteristics attributable to the SiN films in the charge storage layer 4.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor layer;
   a first insulating film disposed on the semiconductor layer;
   a charge storage layer disposed on the first insulating film;
   a second insulating film disposed on the charge storage layer; and
   an electrode layer disposed on the second insulating film,
   wherein the charge storage layer includes a first layer containing silicon and nitrogen, a second layer containing metal and nitrogen, and a third layer containing silicon and nitrogen, the second layer being provided between the first layer and the third layer.

2. The semiconductor device according to claim 1, wherein the charge storage layer further includes a fourth layer containing metal and nitrogen, the fourth layer being provided between the third layer and the second insulating film.

3. The semiconductor device according to claim 2, wherein the charge storage layer further includes a fifth layer containing silicon and nitrogen, the fifth layer being provided between the fourth layer and the second insulating film.

4. The semiconductor device according to claim 1, wherein the metal includes at least one of aluminum, hafnium or zirconium.

5. The semiconductor device according to claim 4, wherein the metal is aluminum.

6. The semiconductor device according to claim 3, wherein the metal contained in the fourth layer includes at least one of aluminum, hafnium or zirconium.

7. The semiconductor device according to claim 6, wherein the metal contained in the fourth layer is aluminum.

8. The semiconductor device according to claim 1, wherein the semiconductor layer penetrates a plurality of conductive layers in a first direction.

9. A semiconductor device comprising:
   a substrate:
   a stacked body provided above the substrate and including a plurality of first electrode layers and a plurality of first insulating layers alternately stacked in a first direction crossing a surface of the substrate;
   a semiconductor layer extending through the stacked body in the first direction; and
   a charge storage layer provided between the semiconductor layer and the stacked body, wherein the charge storage layer includes a first layer containing silicon nitride, a second layer containing aluminum nitride and a third layer containing silicon nitride, the second layer being provided between the first layer and the third layer.

10. The semiconductor device according to claim 9, further comprising:
    an insulating film disposed on the charge storage layer,
    wherein the charge storage layer further includes a fourth layer containing metal and nitrogen, the fourth layer being provided between the third layer and the insulating film.

11. The semiconductor device according to claim 10, wherein the charge storage layer further includes a fifth layer containing silicon and nitrogen, the fifth layer being provided between the fourth layer and the insulating film.

12. The semiconductor device according to claim 9, wherein the metal includes at least one of aluminum, hafnium or zirconium.

13. The semiconductor device according to claim 12, wherein the metal is aluminum.

14. The semiconductor device according to claim 11, wherein the metal contained in the fourth layer includes at least one of aluminum, hafnium or zirconium.

15. The semiconductor device according to claim 14, wherein the metal contained in the fourth layer is aluminum.

* * * * *